United States Patent
Yamaguchi et al.

(10) Patent No.: US 10,294,324 B2
(45) Date of Patent: May 21, 2019

(54) RESIN COMPOSITION, CONDUCTIVE RESIN COMPOSITION, ADHESIVE, CONDUCTIVE ADHESIVE, PASTE FOR FORMING ELECTRODES, AND SEMICONDUCTOR DEVICE

(71) Applicant: NAMICS CORPORATION, Niigata (JP)

(72) Inventors: Takashi Yamaguchi, Niigata (JP); Shinichi Abe, Niigata (JP)

(73) Assignee: NAMICS CORPORATION, Niigata (JP)

(*) Notice: Subject to any disclaimer, the term of this patent is extended or adjusted under 35 U.S.C. 154(b) by 0 days.

(21) Appl. No.: 15/562,255

(22) PCT Filed: Mar. 28, 2016

(86) PCT No.: PCT/JP2016/059842
§ 371 (c)(1),
(2) Date: Sep. 27, 2017

(87) PCT Pub. No.: WO2016/158828
PCT Pub. Date: Oct. 6, 2016

(65) Prior Publication Data
US 2018/0079856 A1 Mar. 22, 2018

(30) Foreign Application Priority Data
Mar. 31, 2015 (JP) .................. 2015-071462

(51) Int. Cl.
*C09J 9/02* (2006.01)
*C08G 59/56* (2006.01)
(Continued)

(52) U.S. Cl.
CPC .............. *C08G 59/60* (2013.01); *C08G 59/56* (2013.01); *C08G 73/12* (2013.01); *C08L 61/34* (2013.01);
(Continued)

(58) Field of Classification Search
CPC ...................................................... C09J 133/02
USPC ....................................................... 428/402
See application file for complete search history.

(56) References Cited

U.S. PATENT DOCUMENTS

2010/0143728 A1 6/2010 Kotake
2012/0077401 A1 3/2012 Kotake
(Continued)

FOREIGN PATENT DOCUMENTS

JP 2005048054 A2 2/2005
JP 2008111096 A2 5/2008
(Continued)

OTHER PUBLICATIONS

International Search Report dated Jun. 7, 2016 filed in PCT/JP2016/059842.

*Primary Examiner* — Khanh T Nguyen
(74) *Attorney, Agent, or Firm* — Rankin, Hill & Clark LLP

(57) ABSTRACT

There is provided a resin composition which has long-term heat resistance, rapid curing properties, high adhesive strength during heating, a low change ratio of adhesive strength, and a low normal temperature elastic modulus. The resin composition includes (A) a compound having in its molecule an OH group and any one of primary to tertiary amines, (B) dicyandiamide and/or imidazoles, (C) bismaleimides, and (D) a compound having in its molecule one or more epoxy groups, or cyanate ester.

13 Claims, 1 Drawing Sheet

Figure 1:
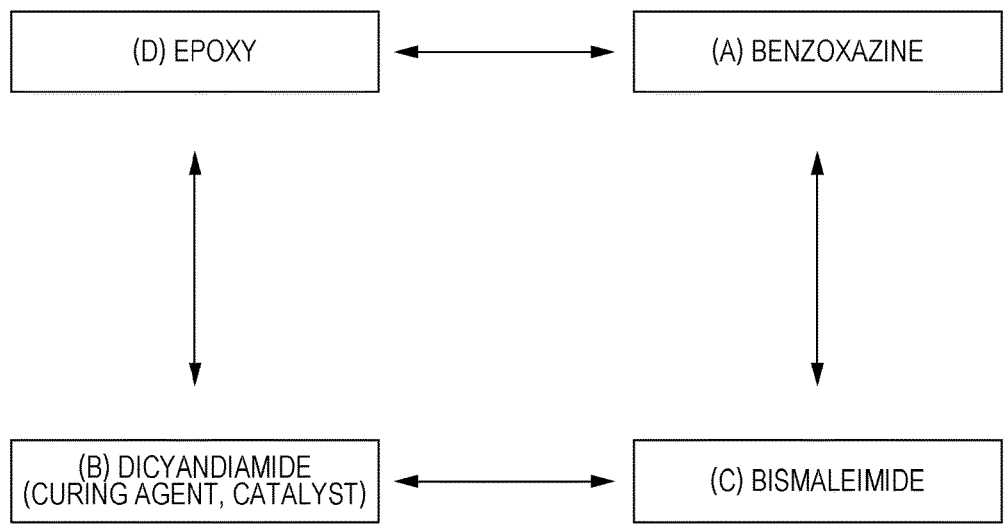

(51) Int. Cl.
    *C08G 59/60*     (2006.01)
    *C08G 73/12*     (2006.01)
    *C09J 11/06*     (2006.01)
    *C09J 161/34*     (2006.01)
    *C09J 163/00*     (2006.01)
    *C09J 179/04*     (2006.01)
    *C08L 61/34*     (2006.01)
    *C08L 63/00*     (2006.01)
    *H01L 21/288*     (2006.01)
    *C09J 11/04*     (2006.01)
    *C08L 79/02*     (2006.01)

(52) U.S. Cl.
    CPC ............... *C08L 63/00* (2013.01); *C08L 79/02* (2013.01); *C09J 9/02* (2013.01); *C09J 11/04* (2013.01); *C09J 11/06* (2013.01); *C09J 161/34* (2013.01); *C09J 163/00* (2013.01); *C09J 179/04* (2013.01); *H01L 21/288* (2013.01)

(56) References Cited

U.S. PATENT DOCUMENTS

| | | |
|---|---|---|
| 2014/0199549 A1 | 7/2014 | Shin |
| 2015/0189746 A1 | 7/2015 | Liu |
| 2015/0203715 A1 | 7/2015 | Kotake |

FOREIGN PATENT DOCUMENTS

| | | | |
|---|---|---|---|
| JP | 2010229227 | A2 | 10/2010 |
| JP | 2010248473 | A2 | 11/2010 |
| JP | 2012213888 | A2 | 11/2012 |
| JP | 2013173819 | A2 | 9/2013 |
| JP | 2014523953 | | 9/2014 |

RESIN COMPOSITION, CONDUCTIVE RESIN COMPOSITION, ADHESIVE, CONDUCTIVE ADHESIVE, PASTE FOR FORMING ELECTRODES, AND SEMICONDUCTOR DEVICE

TECHNICAL FIELD

The present invention relates to a resin composition, a conductive resin composition, an adhesive, a conductive adhesive, a paste for forming electrodes, and a semiconductor device.

BACKGROUND ART

A resin composition is used as a sealing material or an adhesive for a wiring board, a circuit board, a circuit plate including multiple layers of wiring boards and circuit boards, a semiconductor chip, a coil, an electrical circuit, an automobile component, and the like. Such a resin composition is required to have heat resistance and properties of rapidly curing (hereinafter, sometimes referred to as "rapid curing properties").

For example, Patent Literature 1 discloses an epoxy resin composition obtained with an addition reactant between unsubstituted imidazole as a curing agent and bisphenol-type diglycidyl ether. Such an epoxy resin composition rapidly cures, and can form a cured resin layer which is voidless and has excellent adhesiveness.

Patent Literature 2 discloses a thermosetting resin composition which includes a copolymer resin containing a curing agent having an acidic substituent and an unsaturated maleimide group, dicyandiamide, and a specific monomer unit, and epoxy resin. Such a thermosetting resin composition has metal foil adhesiveness, heat resistance, and the like.

CITATION LIST

Patent Literature

Patent Literature 1: JP-A-2005-48054
Patent Literature 2: JP-A-2008-111096

SUMMARY OF THE INVENTION

Problems to be Solved by the Invention

Here, when the resin composition is used, high adhesive strength during heating is required as well as heat resistance and rapid curing properties. In particular, it is preferable that the change ratio in adhesive strength between during normal temperature and during heating (the change ratio of adhesive strength) be low. Furthermore, it is desirable that a cured product of the resin composition have flexibility. That is, it is preferable that when the resin composition is cured, a normal temperature elastic modulus be low.

An object of the present invention is to provide a resin composition, a conductive resin composition, an adhesive, a conductive adhesive, a paste for forming electrodes, and a semiconductor device, which have long-term heat resistance, rapid curing properties, high adhesive strength during heating, a low change ratio of adhesive strength, and a low normal temperature elastic modulus.

Solution to the Problems

The present inventor found that a resin composition which includes a compound having in its molecule an OH group and any one of primary to tertiary amines, dicyandiamide and/or imidazoles, bismaleimides, and a compound having in its molecule one or more epoxy groups, or cyanate ester, has long-term heat resistance, rapid curing properties, high adhesive strength during heating, a low change ratio of adhesive strength, and a low normal temperature elastic modulus. The present invention has been accomplished based on these findings.

The present invention provides a resin composition, a conductive resin composition, an adhesive, a conductive adhesive, a paste for forming electrodes, and a semiconductor device, which solve the above-described problems by having the following configuration.

[1] A resin composition including: (A) a compound having in its molecule an OH group and any one of primary to tertiary amines; (B) dicyandiamide and/or imidazoles; (C) bismaleimides; and (D) a compound having in its molecule one or more epoxy groups, or cyanate ester.
[2] The resin composition according to [1], wherein (C) and/or (D) is a compound having a dimer acid backbone.
[3] The resin composition according to [1] or [2], wherein (A) is a compound having a benzoxazine backbone.
[4] A conductive resin composition including the resin composition according to any one of [1] to [3] and a conductive filler.
[5] An adhesive including the resin composition according to [1] to [3].
[6] A conductive adhesive including the conductive resin composition according to [4].
[7] A paste for forming electrodes including the conductive resin composition according to [4].
[8] A semiconductor device including: a cured product of the resin composition according to any one of [1] to [3]; a cured product of the conductive resin composition according to [4]; a cured product of the adhesive according to [5]; a cured product of the conductive adhesive according to [6]; or a cured product of the paste for forming electrodes according to [7].

Effects of the Invention

The resin composition according to the present invention has long-term heat resistance, rapid curing properties, high adhesive strength during heating, a low change ratio of adhesive strength, and a low normal temperature elastic modulus.

BRIEF DESCRIPTION OF THE INVENTION

Figure 2:
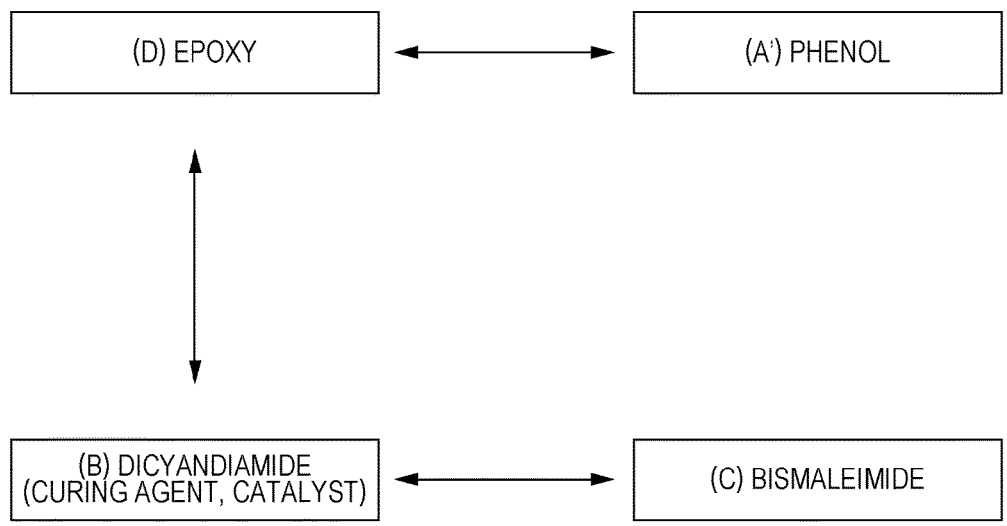

FIG. 1 is a diagram schematically illustrating the structure of resin compositions according to Examples 1 to 21.
FIG. 2 is a diagram schematically illustrating the structure of resin compositions according to Comparative Examples 7 to 11.

DESCRIPTION OF THE EMBODIMENTS

The resin composition according to the present invention includes (A) a compound having in its molecule an OH group and any one of primary to tertiary amines, (B) dicyandiamide and/or imidazoles, (C) bismaleimides, and (D) a compound having in its molecule one or more epoxy groups, or cyanate ester.

As described herein, "normal temperature" refers to 20° C.±15° C." Being "liquid" refers to having fluidity at normal temperature. Being "solid" refers to not having fluidity at normal temperature. The "weight loss" is the change ratio of weight Y relative to weight X. Here, weight X is a weight of a cured product of the resin composition, and weight Y is a weight of the cured product which has been left to stand at a predetermined temperature for a predetermined period of time (for example, 200° C.×100 hours). Specifically, the weight loss is a value indicated by "weight loss=(|weight X−weight Y|/weight X)×100." Having "long-term heat resistance" refers to being low in weight loss. "Low temperature" refers to a temperature which is lower than a reference temperature that is a temperature at which a compound contained in a resin composition reacts alone (self-polymerizes). For example, bismaleimides are cured at 300° C. or higher. On the other hand, when the resin composition according to the present invention is cured at 200° C., it can be said that "the resin composition according to the present invention is cured at low temperature." "Rapid curing" refers to curing for a shorter time (for example, 30 minutes or less) than a predetermined time. "Adhesive strength" refers to strength with which a resin composition causes a certain object (for example, an alumina test piece) to be adhered. A "change ratio of adhesive strength" is a ratio between the adhesive strength during normal temperature and the adhesive strength during heating. Specifically, the change ratio of adhesive strength is a value indicated by "change ratio of adhesive strength=(|adhesive strength at 200° C.−adhesive strength at normal temperature|/adhesive strength at normal temperature)×100." It can be said that the lower the change ratio of adhesive strength is, the higher heat resistance is. A "normal temperature elastic modulus" is a degree of flexibility at normal temperature of a cured product of a certain resin composition. It can be said that the lower a normal temperature elastic modulus is, the higher flexibility is.

[Compound Having in its Molecule an OH Group and any One of Primary to Tertiary Amines]

Examples of the compound having in its molecule an OH group and any one of primary to tertiary amines may include a compound having a benzoxazine backbone, and aminophenols. From the viewpoint of long-term heat resistance, a compound having a benzoxazine backbone, such as benzoxazine as a highly heat resistant resin, is preferable. It is noted that as described herein, "having in its molecule an OH group" includes not only having in its molecule an OH group itself, like phenols, but also having in its molecule an OH group through ring opening, like benzoxazine.

[Dicyandiamide]

Dicyandiamide ("DICY") is an amide compound represented by $H_2N-CNH-NH-CN$. Dicyandiamide acts as a curing agent to bismaleimides when synthesizing the resin composition according to the present invention. Also, dicyandiamide acts as a catalyst in the reaction between the compound having in its molecule an OH group and any one of primary to tertiary amines and bismaleimides. Dicyandiamide is a compound widely used in industrial applications, and is excellent in adhesiveness, heat resistance, and the like.

[Imidazoles]

Imidazoles ("IMZs") are a heterocyclic compound which contains a nitrogen atom at the 1,3-positions of a 5-membered ring. Imidazoles act as a curing agent to bismaleimides when synthesizing the resin composition according to the present invention. Also, imidazoles act as a catalyst in the reaction between the compound having in its molecule an OH group and any one of primary to tertiary amines and bismaleimides. Examples of imidazoles include 2-methylimidazole, 2-undecylimidazole, 2-heptadecylimidazole, 1,2-dimethylimidazole, 2-phenylimidazole, 2-ethyl-4-methylimidazole, 2-phenyl-4 methylimidazole, 1-benzyl-2-methylimidazole, 1-benzyl-2-phenylimidazole, 2-phenyl-4,5-dihydroxymethylimidazole, 2-phenyl-4-methyl-5-hydroxymethylimidazole, 1-cyanoethyl-2-ethyl-4-methylimidazole, 2,4-diamino-6-[2'-methylimidazolyl-(1')]-ethyl-s-triazine, and 2,4-diamino-6-[2'-methylimidazolyl-(1')]ethyl-s-triazineisocyanuric acid addition product dehydrate.

[Bismaleimides]

Examples of bismaleimides may include N,N'-(4,4'-diphenylmethane)bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, bis-(3-ethyl-5-methyl-4-maleimidephenyl)methane, m-phenylene bismaleimide (N,N'-1,3-phenylene bismaleimide), 1,6-bismaleimide hexane, 1,2-bismaleimide ethane(N,N'-ethylenedimaleimide), N,N'-(1,2-phenylene)bismaleimide, N,N'-1,4-phenylene dimaleimide, N,N'-(sulfonyldi-p-phenylene)dimaleimide, and N,N'-[3,3'-(1,3-phenylenedioxy) diphenyl]bismaleimide.

The bismaleimides in the present invention include solid bismaleimides. However, liquid bismaleimides are more preferable. Solid bismaleimides generally have low solubility to organic solvents. Therefore, when solid bismaleimides are used, a large amount of organic solvents needs to be used for dilution. However, in this case, solvents volatilize during curing, causing formation of a void. A void leads to the decrease of adhesive strength and the occurrence of cracks. In order to prevent this, there is also a method of dispersing solid bismaleimides in the resin composition using a roll mill or the like. However, this method causes the viscosity of the resin composition to increase. On the other hand, the resin composition containing liquid bismaleimides has low viscosity. Therefore, workability when using the resin composition improves.

Also, dimer acid-modified bismaleimides can be used. Examples of dimer acid-modified bismaleimides include BMI-1500 and BMI-1700 as liquid bismaleimide, and BMI-3000 as solid bismaleimides (all are manufactured by Designer molecules Inc.). The use of dimer acid-modified bismaleimides enables the normal temperature elastic modulus of the resin composition to be suppressed low. It is considered that this is because dimer acid-modified bismaleimides have a reactive maleimide group only at both terminals, and does not have a crosslinkable reactive group in its molecular chain. In a cured product of such a resin composition, cracks are unlikely to occur.

[Compound Having in its Molecule One or More Epoxy Groups, or Cyanate Ester]

An example of the compound having in its molecule one or more epoxy groups may include epoxy resin. Examples of epoxy resin may include bisphenol A-type epoxy resin, brominated bisphenol A-type epoxy resin, bisphenol F-type epoxy resin, biphenyl-type epoxy resin, Novolac-type epoxy resin, alicyclic epoxy resin, naphthalene-type epoxy resin, ether-based or polyether-based epoxy resin, oxirane ring-containing polybutadiene, and silicone epoxy copolymer resin.

Also, examples of liquid epoxy resin may include bisphenol A-type epoxy resin having an average molecular weight of approximately 400 or less, branched multifunctional bisphenol A-type epoxy resin such as p-glycidyloxyphenyl dimethyl tris bisphenol A diglycidyl ether, bisphenol F-type epoxy resin, phenol Novolac-type epoxy resin having approximately 570 or less, alicyclic epoxy resin such as vinyl(3,4-cyclohexene)dioxide, 3,4-epoxy cyclohexyl carboxylic acid (3,4-epoxy cyclohexyl)methyl, bis(3,4-epoxy-6-methylcyclohexylmethyl) adipate, and 2-(3,4-epoxycyclohexyl)5,1-spiro(3,4-epoxycyclohexyl)-m-dioxane, biphenyl-type epoxy resin such as 3,3',5,5'-tetramethyl-4,4'-diglycidyloxybiphenyl, glycidyl ester-type epoxy resin such as diglycidyl hexahydrophthalate, diglycidyl 3-methylhexahydrophthalate, and diglycidyl hexahydroterephthalate, glycidyl amine-type epoxy resin such as diglycidyl aniline, diglycidyl toluidine, triglycidyl-p-aminophenol, tetraglycidyl-m-xylylenediamine, and tetraglycidyl bis(aminomethyl)cyclohexane, hydantoin-type epoxy resin such as 1,3-diglycidyl-5-methyl-5-ethylhydantoin, and naphthalene ring-containing epoxy resin. Also, epoxy resin having a silicone backbone such as 1,3-bis(3-glycidoxypropyl)-1,1,3,3-tetramethyldisiloxane can be used. Further examples may include diepoxide compounds such as (poly)ethylene glycol diglycidyl ether, (poly)propylene glycol diglycidyl ether, butanediol glycidyl ether, and neopentyl glycol diglycidyl ether, and triepoxide compounds such as trimethylol propane triglycidyl ether and glycerin triglycidyl ether.

Examples of solid epoxy resin may include orthocresol Novolac-type epoxy resin, phenol Novolac-type epoxy resin, naphthol Novolac-type epoxy resin, modified phenol-type epoxy resin, naphthalene-type epoxy resin, dicyclopentadiene-type epoxy resin, glycidyl amine-type epoxy resin, biphenyl-type epoxy resin, bisphenol A-type epoxy resin, biphenyl aralkyl-type epoxy resin, bisphenol F-type epoxy resin, hydrogenated bisphenol A-type epoxy resin, aliphatic-type epoxy resin, stilbene-type epoxy resin, and bisphenol A Novolac-type epoxy resin, which have a high molecular weight.

One kind of epoxy resin can be used alone. Also, two or more kinds of epoxy resin may be mixed and used. Also, dimer acid-modified epoxy resin may be used. An example of dimer acid-modified epoxy resin may include jER871 (manufactured by Mitsubishi Chemical Corporation). The use of dimer acid-modified epoxy resin enables the normal temperature elastic modulus of the resin composition to be suppressed low. In a cured product of such a resin composition, cracks are unlikely to occur.

Cyanate ester is not particularly limited, as long as it is a compound which contains a cyanato group. An example of cyanate ester is Lecy (manufactured by Lonza Japan Ltd.), which is liquid ester. The use of cyanate ester can improve long-term heat resistance.

[Manufacturing Method of Resin Composition]

The resin composition according to the present invention can be manufactured by mixing: (A) a compound having in its molecule an OH group and any one of primary to tertiary amines (hereinafter, sometimes referred to as an "(A) component"); (B) dicyandiamide and/or imidazoles (hereinafter, sometimes referred to as a "(B) component"); (C) bismaleimides (hereinafter, sometimes referred to as a "(C) component"); and (D) a compound having in its molecule one or more epoxy groups, or cyanate ester (hereinafter, sometimes referred to as a "(D) component"). The manufacturing method of the resin composition is not particularly limited, as long as a composition in which the above-described components are uniformly mixed can be obtained.

[Others]

A conductive material such as a conductive filler may be added to the resin composition, so that the resin composition has conductivity. Examples of the conductive filler may include an Ag filler, an AgSn filler, and an alloy filler thereof. From the viewpoint of conductivity, the conductive material to be used is preferably 19 to 65% by volume (equivalent to 70 to 95% by weight for an Ag filler or the like having a specific gravity of approximately 10), and further preferably 23 to 48% by volume (equivalent to 75 to 90% by weight for an Ag filler or the like having a specific gravity of approximately 10). The resin composition having conductivity (conductive resin composition) is used when an electrical connection is required in a circuit board, an electrical circuit, and the like. Also, a thermally conductive material such as Ag and alumina may be added to the resin composition, so that the resin composition has thermal conductivity. The resin composition having thermal conductivity is used when the heat from a chip and a substrate is required to be released. The normal temperature elastic modulus (tensile elastic modulus) of the resin composition is preferably less than 4 GPa, and more preferably less than 2 GPa. The addition of a large amount of the conductive material or the thermally conductive material sometimes causes the normal temperature elastic modulus to increase to 5 GPa or more. However, even in such a case, it is preferable that the normal temperature elastic modulus be less than 8 GPa. Furthermore, a silica filler or a silicone powder may be added as a filling material to the resin composition. The addition of the filling material such as the silicone powder leads to lowering of elasticity. Also, an additive such as a silane coupling agent may be contained as necessary, within the range that does not impair the effects of the present invention.

[Adhesive and Semiconductor Device]

The resin composition according to the present invention can be used as an adhesive. An adhesive is used for bonding to a circuit of an electronic component, as a die attacher which bonds a semiconductor element and another semiconductor element, and/or as a die attacher which bonds a semiconductor element and a support member for mounting the semiconductor element. When the adhesive is a conductive adhesive, it can be used as an alternative to solder. Since this conductive adhesive contains the resin composition, it has elasticity which is lower than that of soldering. Therefore, this conductive adhesive is highly useful from the viewpoint of stress relaxation. Also, a semiconductor device has a structure in which a semiconductor element and another semiconductor element are bonded together, and/or a structure in which a semiconductor element and a support member for mounting the semiconductor element are bonded together. A semiconductor device which includes a cured product of the resin composition according to the present invention or a cured product of the adhesive according to the present invention is excellent in reliability at a high temperature of 200° C.

EXAMPLE

[Comparison of Quaternary System and Ternary System]

The curing properties, long-term heat resistance, adhesive strength (normal temperature and 200° C.), and normal temperature elastic modulus of each of the resin compositions obtained in Examples 1 to 4 and Comparative Examples 1 to 6 described below were calculated. A quaternary system refers to a system which contains all of the (A) to (D) components (the system according to the present invention). A ternary system is a system which contains any three of the (A) to (D) components.

As the (A) component, there was used a 66% solution prepared by diluting "F-a type benzoxazine" (manufactured by Shikoku Chemicals Corporation) with butyl carbitol acetate (hereinafter, sometimes referred to as "BCA").

As the (B) component, any one of the below-indicated components was used.

"EH-3636AS" (DICY 100%) manufactured by Adeka Corporation

"EH-3842" (DICY 64%, accelerator 36%) manufactured by Adeka Corporation

"2PHZ-PW" (2-phenyl-4,5-dihydroxymethylimidazole) manufactured by Shikoku Chemicals Corporation "2P4MHZ-PW" (2-phenyl-4-methyl-5-hydroxymethyl-imidazole) manufactured by Shikoku Chemicals Corporation As the (C) component, any one of the below-indicated components was used.

"BMI" (solid, 4,4'-diphenylmethane bismaleimide) manufactured by K.I Chemical Industry Co., Ltd.

"BMI-1500" (liquid, dimer acid-modified) manufactured by Designer molecules Inc.

As the (D) component, any one of the below-indicated components was used.

"EXA-835LV" (BisA-BisF mixed epoxy) manufactured by DIC Corporation

"jER871" (dimer acid-modified epoxy) manufactured by Mitsubishi Chemical Corporation Example 1

Into a container, there were poured 2 parts (solid content: 1.33 parts) of a 66% solution of "F-a type benzoxazine," 0.3 parts of "EH-3636AS," 1 part of "BMI-1500," and 1 part of "EXA-835LV." The mixture was hand-stirred. Thereafter, the obtained product was dispersed using a triple roll mil, thereby to prepare a resin composition a.

Example 2

Into a container, there were poured 2 parts (solid content: 1.33 parts) of a 66% solution of "F-a type benzoxazine," 0.1 parts of "2PHZ-PW," 1 part of "BMI," and 1 part of "jER871." The mixture was hand-stirred. Thereafter, the obtained product was dispersed using a triple roll mil, thereby to prepare a resin composition b.

Example 3

Into a container, there were poured 2 parts (solid content: 1.33 parts) of a 66% solution of "F-a type benzoxazine," 0.1 parts of "2PHZ-PW," 1.5 parts of "BMI-1500," and 1 part of "jER871." The mixture was hand-stirred. Thereafter, the obtained product was dispersed using a triple roll mil, thereby to prepare a resin composition c.

Example 4

Into a container, there were poured 2 parts (solid content: 1.33 parts) of a 66% solution of "F-a type benzoxazine," 0.1 parts of "2P4MHZ-PW," 1.5 parts of "BMI-1500," and 1 part of "jER871." The mixture was hand-stirred. Thereafter, the obtained product was dispersed using a triple roll mil, thereby to prepare a resin composition d.

Comparative Example 1

Into a container, there were poured 2 parts (solid content: 1.33 parts) of a 66% solution of "F-a type benzoxazine," 0.3 parts of "EH-3636AS," and 1 part of "EXA-835LV." The mixture was hand-stirred. Thereafter, the obtained product was dispersed using a triple roll mil, thereby to prepare a resin composition α.

Comparative Example 2

Into a container, there were poured 2 parts (solid content: 1.33 parts) of a 66% solution of "F-a type benzoxazine," 1 part of "BMI-1500," and 1 part of "EXA-835LV" The mixture was hand-stirred. Thereafter, the obtained product was dispersed using a triple roll mil, thereby to prepare a resin composition β.

Comparative Example 3

Into a container, there were poured 0.3 parts of "EH-3636AS," 1 part of "BMI-1500," and 1 part of "EXA-835LV" The mixture was hand-stirred. Thereafter, the obtained product was dispersed using a triple roll mil, thereby to prepare a resin composition γ.

Comparative Example 4

Into a container, there were poured 2 parts (solid content: 1.33 parts) of a 66% solution of "F-a type benzoxazine," 0.1 parts of "2PHZ-PW," and 1 part of "BMI." The mixture was hand-stirred. Thereafter, the obtained product was dispersed using a triple roll mil, thereby to prepare a resin composition δ.

Comparative Example 5

Into a container, there were poured 2 parts (solid content: 1.33 parts) of a 66% solution of "F-a type benzoxazine," 0.1 parts of "2PHZ-PW," and 1.5 parts of "BMI-1500." The mixture was hand-stirred. Thereafter, the obtained product was dispersed using a triple roll mil, thereby to prepare a resin composition ε.

Comparative Example 6

Into a container, there were poured 2 parts (solid content: 1.33 parts) of a 66% solution of "F-a type benzoxazine," 0.1 parts of "2P4MHZ-PW," and 1.5 parts of "BMI-1500." The mixture was hand-stirred. Thereafter, the obtained product was dispersed using a triple roll mil, thereby to prepare a resin composition ζ.

It is noted that Comparative Examples 1 to 3 are examples of the ternary system in which any one of the (A) to (C) components is excluded from the quaternary system of Example 1. Comparative Example 4 is an example of the ternary system in which the (D) component of the quaternary system of Example 2 lacks. Comparative Example 5 is an example of the ternary system in which the (D) component of the quaternary system of Example 3 lacks. Comparative Example 6 is an example of the ternary system in which the (D) component of the quaternary system of Example 4 lacks.

(Measurement of Curing Properties)

The curing properties were measured as follows. First, the resin composition was cured (curing condition: 200° C. in temperature, 30 minutes), thereby to prepare a plate-like cured film. Then, differential scanning calorimetry (DSC) was performed for each cured film using an apparatus "DSC204 F1" manufactured by NETZSCH. The measurement condition is 25° C. to 350° C., and 10° C./min in temperature increasing rates.

The measurement results were evaluated as follows. That is, the cured film which did not exhibit an exothermic peak at 300° C. or lower was evaluated as "Good," indicating excellent curing properties. The cured film which exhibited an exothermic peak at 300° C. or lower was evaluated as "Poor."

(Calculation of Long-Term Heat Resistance)

The long-term heat resistance was calculated as follows. First, similarly to the measurement of curing properties, the resin composition was cured thereby to prepare a plate-like cured film. Then, the weight of the cured film was measured. Next, the cured film was left to stand in an oven ("DF411" manufactured by Yamato Scientific Co., Ltd.) set at 200° C. for 100 hours. Then, the weight of the cured film which has been left to stand was measured. Then, the weight loss was calculated based on the weight of the cured film before having been left to stand and the weight of the cured film after having been left to stand.

The calculation results were evaluated as follows. The cured film which exhibited the weight loss of less than 8% was evaluated as "Good," indicating excellent long-term heat resistance. The weight loss of 8 to 12% was evaluated as "Fair." The weight loss of 12% or more was evaluated as "Poor."

(Measurement of Adhesive Strength)

Using a #200 mesh screen mask having openings of 1.5-mm square×25, the resin composition was applied onto a 20-mm square alumina substrate. Then, there was prepared a test piece having ten 3.2 mm×1.6 mm-size alumina chips mounted on ten of the 25 print patterns. Then, curing was performed in the curing condition of "200° C. in temperature, 30 minutes." The shear strength of this test piece was measured using a strength tester (Model No. 1605HTP, manufactured by Aikoh Engineering Co., Ltd.), thereby to calculate adhesive strength at normal temperature.

In the measurement results, the adhesive strength of 30 N/mm$^2$ or more was evaluated as "Good." Also, the adhesive strength of 30 to 20 N/mm$^2$ was evaluated as "Fair." Moreover, the adhesive strength of less than 20 N/mm$^2$ was evaluated as "Poor."

Also, the above-described test piece having been cured in the curing condition of "200° C. in temperature, 30 minutes" was heated on a hot plate at 200° C. for one minute or more. In this state, the shear strength of this test piece was measured using a strength tester (same as the above). Thus, the adhesive strength at 200° C. (adhesive strength during heating) was calculated.

In the measurement results, the adhesive strength of 7 N/mm$^2$ or more was evaluated as "Good." Also, the adhesive strength of 7 to 5 N/mm$^2$ was evaluated as "Fair." Moreover, the adhesive strength of less than 5 N/mm$^2$ was evaluated as "Poor."

Furthermore, the change ratio of adhesive strength of the resin composition was calculated based on the value of adhesive strength at normal temperature and the value of adhesive strength at 200° C.

In the calculation results, the change ratio of less than 85% was evaluated as "Good." Also, the change ratio of 85% or more was evaluated as "Poor."

(Measurement of Normal Temperature Elastic Modulus)

The resin composition applied on a Teflon (registered trademark) sheet in such a manner as to have a film thickness of approximately 150 μm was cured into a sheet shape at 200° C.×30 minutes. A strip having a size of 40 mm×10 mm was cut out. The tensile elastic modulus at room temperature of this strip was calculated using DMS6100 manufactured by SII Nano Technology Inc. The tensile elastic modulus is preferably less than 4 GPa, and more preferably less than 2 GPa.

In the measurement results, the normal temperature elastic modulus of less than 2 GPa was evaluated as "Good." Also, the normal temperature elastic modulus of 2 to 5 GPa was evaluated as "Fair." Furthermore, the normal temperature elastic modulus of 5 GPa or more was evaluated as "Poor."

The above-described measurement results and calculation results were comprehensively evaluated. The result having one Fair was evaluated as "Excellent." Also, the result having two or three Fairs was evaluated as "Good." Furthermore, the result having one or more Poors was evaluated as "Poor." The resin composition having a comprehensive evaluation of "Excellent" or "Good" is the resin composition according to the present invention.

TABLE 1

| Component | Formulation [parts] * Converted into solid content | Example 1 (Resin composition a) | Example 2 (Resin composition b) | Example 3 (Resin composition c) | Example 4 (Resin composition d) | Comparative Example 1 (Resin composition α) |
|---|---|---|---|---|---|---|
| (A) | F-a type benzoxazine | 1.33 | 1.33 | 1.33 | 1.33 | 1.33 |
| (B) | EH-3636AS (DICY) | 0.3 | | | | 0.3 |
| | EH-3642 (DICY + accelerator) | | | | | |
| | 2PHZ-PW (IMZ) | | 0.1 | 0.1 | | |
| | 2P4MHZ-PW (IMZ) | | | | 0.1 | |
| (C) | BMI (solid) | | 1 | | | |
| | BMI-1500 (liquid/dimer acid-modified) | 1 | | 1.5 | 1.5 | |
| (D) | EXA-835LV | 1 | | | | 1 |
| | jER871 | | 1 | 1 | 1 | |
| Measurement results | Curing properties (200° C. × 30 minutes effects) | Good | Good | Good | Good | Good |
| | Heat resistance (weight loss) [%] | Fair (11.1) | Good (4.2) | Fair (10.5) | Fair (10.9) | Good (3.6) |
| | Adhesive strength (normal temperature) [N/mm$^2$] | Good (41.7) | Good (52.0) | Good (41.3) | Good (43.4) | Good (65.5) |
| | Adhesive strength (200° C.) [N/mm$^2$] | Good (10.5) | Good (8.8) | Good (7.2) | Good (7.8) | Good (9.0) |

TABLE 1-continued

| | | | | | | |
|---|---|---|---|---|---|---|
| | Strength change ratio (%) | Good (74.8) | Good (83.1) | Good (82.0) | Good (82.0) | Poor (86.3) |
| | Normal temperature elastic modulus (Gpa) | Fair (2.4) | Fair (3.8) | Good (1.7) | Good (1.9) | Poor (5.1) |
| | Comprehensive evaluation | Good | Excellent | Excellent | Excellent | Poor |

| Component | Formulation [parts] * Converted into solid content | Comparative Example 2 (Resin composition β) | Comparative Example 3 (Resin composition γ) | Comparative Example 4 (Resin composition δ) | Comparative Example 5 (Resin composition ε) | Comparative Example 6 (Resin composition ζ) |
|---|---|---|---|---|---|---|
| (A) | F-a type benzoxazine | 1.33 | | 1.33 | 1.33 | 1.33 |
| (B) | EH-3636AS (DICY) | | 0.3 | | | |
| | EH-3642 (DICY + accelerator) | | | | | |
| | 2PHZ-PW (IMZ) | | | 0.1 | 0.1 | |
| | 2P4MHZ-PW (IMZ) | | | | | 0.1 |
| (C) | BMI (solid) | | | 1 | | |
| | BMI-1500 (liquid/dimer acid-modified) | 1 | 1 | | 1.5 | 1.5 |
| (D) | EXA-835LV | 1 | 1 | | | |
| | jER871 | | | | | |
| Measurement results | Curing properties (200° C. × 30 minutes effects) | Good | Good | Good | Good | Good |
| | Heat resistance (weight loss) [%] | Poor(14.6) | Fair (11.5) | Good (1.0) | Fair (9.5) | Fair (8.6) |
| | Adhesive strength (normal temperature) [N/mm²] | Good (32.8) | Good (37.6) | Good (50.0) | Good (38.8) | Good (43.6) |
| | Adhesive strength (200° C.) [N/mm²] | Poor (1.4) | Poor (4.1) | Fair (6.4) | Fair (5.3) | Fair (5.8) |
| | Strength change ratio (%) | Poor (95.7) | Poor (89.1) | Poor (87.2) | Poor (86.3) | Poor (86.7) |
| | Normal temperature elastic modulus (Gpa) | Poor (5.6) | Fair (2.6) | Poor (5.1) | Fair (2.1) | Fair (2.3) |
| | Comprehensive evaluation | Poor | Poor | Poor | Poor | Poor |

As illustrated in Table 1, all of the resin compositions according to Examples 1 to 4 were cured at a low temperature and for a short time of 200° C.×30 minutes. Also, the resin compositions according to Examples 1 to 4 ensured long-term heat resistance to a certain degree.

Furthermore, there was obtained the result that the resin compositions according to Examples 1 to 4 have a roughly high adhesive strength during heating and a low change ratio of adhesive strength, compared to the resin compositions according to Comparative Examples 1 to 6. Also, there was obtained the result that the resin compositions according to Examples 1 to 4 have a roughly low normal temperature elastic modulus, compared to the resin compositions according to Comparative Examples 1 to 6.

It is considered that the reason why the adhesive strength during heating is high in the resin compositions according to Examples 1 to 4 is that the crosslink density increases by the reaction between an OH group of the (A) component and an epoxy group of the (D) component. This is also inferred from the fact that Comparative Example 1 containing the (A) component and the (D) component also exhibits high adhesive strength during heating. In this connection, it is considered that the reason why Comparative Example 2 containing the (A) component and the (D) component exhibits low adhesive strength during heating is that the (B) component to act as a catalyst is not contained.

Also, it is considered that in the resin compositions according to Examples 1 to 4, an N group of the (A) component reacts with the (C) component, and furthermore, an OH group of the (A) component reacts with the (D) component. That is, it is considered that the (A) component acts as a crosslinking agent between the (C) component and the (D) component. Therefore, it is considered that in the resin compositions according to Examples 1 to 4, each of the (A) component to the (D) component reacts to have a two-dimensional structure as indicated in FIG. 1. Such a structure allows its molecular chain to expand and contract in a two-dimensional manner. Therefore, flexibility is high. That is, it is considered that the reason why the resin compositions according to Examples 1 to 4 have a low normal temperature elastic modulus is attributable to such a two-dimensional structure.

[Influence by Variation of (A) or (B) Component on Curing Properties and Others]

The curing properties, long-term heat resistance, adhesive strength (normal temperature and 200° C.), and normal temperature elastic modulus of the resin compositions obtained in Examples 5 to 18 and Comparative Examples 7 to 12 described below were calculated.

As the (A) component in Examples and Comparative Example 12, there was used a 66% solution of "F-a type benzoxazine" used in Example 1 and the like, or a 50% solution prepared by diluting "P-d type benzoxazine" (manufactured by Shikoku Chemicals Corporation) with butyl carbitol acetate (hereinafter, sometimes referred to as "BCA").

On the other hand, in Comparative Examples 7 to 11, any one of the following components was used instead of the (A) component (indicated as (A') in Table 2).

"H-4" (phenolic resin, Tg (glass transition point) 123° C.), manufactured by Meiwa Plastic Industries, Ltd.

"MEH-7500" (phenolic resin, Tg 170° C.) manufactured by Meiwa Plastic Industries, Ltd.

"MEH-8005" (phenolic resin, Tg 105° C.) manufactured by Meiwa Plastic Industries, Ltd.

There was used a 50% solution prepared by diluting "H-4" and "MEH-7500" with butyl carbitol (BC). "MEH-8005" was used as it is.

As the (B) component in Examples, there was used at least one of "EH-3636AS," "EH-3842," and "2PHZ-PW." On the other hand, in Comparative Examples, there was used "EH-3636AS," or "DDH" (dodecanediohydrazide, manufactured by Tokyo Chemical Industry Co., Ltd., indicated as (B') in Table 2) as an amine-based curing agent.

As the (C) component, there was used any one of "BMI," "BMI-1500," and the following components.

"BMI-1700" (liquid, dimer acid-modified) manufactured by Designer molecules Inc.

"BMI-3000" (solid, dimer acid-modified) manufactured by Designer molecules Inc.

As the (D) component, there was used "EXA-835LV," "jER871," or "Lecy" (manufactured by Lonza Japan Ltd.) as liquid cyanate ester.

As an additive, there was used any one of the following additives.

Ag filler, scaly, tap density 4.0 g/cc, specific surface area 0.6 m$^2$/g silane coupling agent (3-glycidoxypropyltrimethoxysilane) KBM-403 manufactured by Shin-Etsu Chemical Co., Ltd.

Example 5

Into a container, there were poured 2 parts (solid content: 1.33 parts) of a 66% solution of "F-a type benzoxazine," 0.3 parts of "EH-3636AS," 1 part of "BMI-1500," and 1 part of "jER871." The mixture was hand-stirred. Thereafter, the obtained product was dispersed using a triple roll mil, thereby to prepare a resin composition e.

Example 6

Into a container, there were poured 2 parts (solid content: 1.33 parts) of a 66% solution of "F-a type benzoxazine," 0.3 parts of "EH-3636AS," 1 part of "BMI-1500," 0.5 parts of "EXA-835LV," and 0.5 parts of "jER871." The mixture was hand-stirred. Thereafter, the obtained product was dispersed using a triple roll mil, thereby to prepare a resin composition f.

Example 7

Into a container, there were poured 2 parts (solid content: 1.33 parts) of a 66% solution of "F-a type benzoxazine," 0.3 parts of "EH-3636AS," 1 part of "BMI," and 1 part of "EXA-835LV." The mixture was hand-stirred. Thereafter, the obtained product was dispersed using a triple roll mil, thereby to prepare a resin composition g.

Example 8

Into a container, there were poured 2 parts (solid content: 1.33 parts) of a 66% solution of "F-a type benzoxazine," 0.1 parts of "EH-3842," 2 parts of "BMI-1500," and 1.5 parts of "jER871." The mixture was hand-stirred. Thereafter, the obtained product was dispersed using a triple roll mil, thereby to prepare a resin composition h.

Example 9

Into a container, there were poured 2 parts (solid content: 1.33 parts) of a 66% solution of "F-a type benzoxazine," 0.3 parts of "EH-3636AS," 1 part of "BMI-3000," and 1.5 parts of "jER871." The mixture was hand-stirred. Thereafter, the obtained product was dispersed using a triple roll mil, thereby to prepare a resin composition i.

Example 10

Into a container, there were poured 2 parts (solid content: 1.33 parts) of a 66% solution of "F-a type benzoxazine," 0.3 parts of "EH-3636AS," 1 part of "BMI1500," 1 part of "jER871," and 9 parts of an "Ag filler." The mixture was hand-stirred. Thereafter, the obtained product was dispersed using a triple roll mil, thereby to prepare a resin composition j.

Example 11

Into a container, there were poured 2 parts (solid content: 1.33 parts) of a 66% solution of "F-a type benzoxazine," 0.1 parts of "EH-3842," 1 part of "BMI-1500," and 1 part of "EXA-835LV." The mixture was hand-stirred. Thereafter, the obtained product was dispersed using a triple roll mil, thereby to prepare a resin composition k.

Example 12

Into a container, there were poured 2 parts (solid content: 1.33 parts) of a 50% solution of "P-d type benzoxazine," 0.3 parts of "EH-3636AS," 1 part of "BMI-1500," and 1 part of "EXA-835LV." The mixture was hand-stirred. Thereafter, the obtained product was dispersed using a triple roll mil, thereby to prepare a resin composition l.

Example 13

Into a container, there were poured 2 parts (solid content: 1.33 parts) of a 66% solution of "F-a type benzoxazine," 0.3 parts of "EH-3636AS," 1 part of "BMI-1700," and 1 part of "jER871." The mixture was hand-stirred. Thereafter, the obtained product was dispersed using a triple roll mil, thereby to prepare a resin composition m.

Example 14

Into a container, there were poured 2 parts (solid content: 1.33 parts) of a 66% solution of "F-a type benzoxazine," 0.3 parts of "EH-3636AS," 1 part of "BMI1500," 1 part of "jER871," and 0.05 parts of a "silane coupling agent." The mixture was hand-stirred. Thereafter, the obtained product was dispersed using a triple roll mil, thereby to prepare a resin composition n.

Example 15

Into a container, there were poured 2 parts (solid content: 1.33 parts) of a 66% solution of "F-a type benzoxazine," 0.45 parts of "EH-3636AS," 2 parts of "BMI-1500," and 0.75 parts of "jER871." The mixture was hand-stirred.

Thereafter, the obtained product was dispersed using a triple roll mil, thereby to prepare a resin composition o.

Example 16

Into a container, there were poured 3 parts (solid content: 2 parts) of a 66% solution of "F-a type benzoxazine," 0.3 parts of "EH-3636AS," 2 parts of "BMI-1500," and 1 part of "jER871." The mixture was hand-stirred. Thereafter, the obtained product was dispersed using a triple roll mil, thereby to prepare a resin composition p.

Example 17

Into a container, there were poured 2 parts (solid content: 1.33 parts) of a 66% solution of "F-a type benzoxazine," 0.2 parts of "EH-3636AS," 0.1 parts of "2PHZ-PW," 1 part of "BMI-1500," and 1 part of "jER871." The mixture was hand-stirred. Thereafter, the obtained product was dispersed using a triple roll mil, thereby to prepare a resin composition q.

Example 18

Into a container, there were poured 2 parts (solid content: 1.33 parts) of a 66% solution of "F-a type benzoxazine," 0.3 parts of "EH-3636AS," 1 part of "BMI-1500," and 1 part of "Lecy." The mixture was hand-stirred. Thereafter, the obtained product was dispersed using a triple roll mil, thereby to prepare a resin composition r.

Comparative Example 7

Into a container, there were poured 2.66 parts (solid content: 1.33 parts) of a 50% solution of "H-4," 0.3 parts of "EH-3636AS," 1 part of "BMI-1500," and 1 part of "jER871." The mixture was hand-stirred. Thereafter, the obtained product was dispersed using a triple roll mil, thereby to prepare a resin composition η.

Comparative Example 8

Into a container, there were poured 2.66 parts (solid content: 1.33 parts) of a 50% solution of "MEH-7500," 0.3 parts of "EH-3636AS," 1 part of "BMI-1500," and 1 part of "jER871." The mixture was hand-stirred. Thereafter, the obtained product was dispersed using a triple roll mil, thereby to prepare a resin composition θ.

Comparative Example 9

Into a container, there were poured 2 parts (solid content: 1.33 parts) of a 66% solution of "MEH-8005," 0.3 parts of "EH-3636AS," 1 part of "BMI-1500," and 1 part of "jER871." The mixture was hand-stirred. Thereafter, the obtained product was dispersed using a triple roll mil, thereby to prepare a resin composition ι.

Comparative Example 10

Into a container, there were poured 2 parts (solid content: 1 part) of a 50% solution of "H-4," 0.3 parts of "EH-3636AS," 1 part of "BMI-1500," and 1 part of "EXA-835LV." The mixture was hand-stirred. Thereafter, the obtained product was dispersed using a triple roll mil, thereby to prepare a resin composition κ.

Comparative Example 11

Into a container, there were poured 2 parts (solid content: 1 part) of a 50% solution of "MEH-7500," 0.3 parts of "EH-3636AS," 1 part of "BMI-1500," and 1 part of "EXA-835LV." The mixture was hand-stirred. Thereafter, the obtained product was dispersed using a triple roll mil, thereby to prepare a resin composition λ.

Comparative Example 12

Into a container, there were poured 2 parts (solid content: 1.33 parts) of a 66% solution of "F-a type benzoxazine," 1 part of "DDH," 1 part of "BMI-1500," and 1 part of "EXA-835LV." The mixture was hand-stirred. Thereafter, the obtained product was dispersed using a triple roll mil, thereby to prepare a resin composition μ.

It is noted that the measurement method of curing properties is the same as that in Example 1 or the like described above.

TABLE 2-1

| Component | Formulation [parts] * Converted into solid content | Example 5 (Resin composition e) | Example 6 (Resin composition f) | Example 7 (Resin composition g) | Example 8 (Resin composition h) | Example 9 (Resin composition i) |
|---|---|---|---|---|---|---|
| (A) | F-a type benzoxazine | 1.33 | 1.33 | 1.33 | 1.33 | 1.33 |
|  | P-d type benzoxazine |  |  |  |  |  |
| (A') | H-4 (phenol/Tg 123° C.) |  |  |  |  |  |
|  | MEH-7500 (phenol/Tg 170° C.) |  |  |  |  |  |
|  | MEH-8005 (phenol/Tg 105° C.) |  |  |  |  |  |
| (B) | EH-3636AS (DICY) | 0.3 | 0.3 | 0.3 |  | 0.3 |
|  | EH-3842 (DICY + accelerator) |  |  |  | 0.1 |  |
|  | 2PHZ-PW (IMZ) |  |  |  |  |  |
|  | 2P4MHZ-PW (IMZ) |  |  |  |  |  |
| (B') | DDH |  |  |  |  |  |
| (C) | BMI (solid) |  |  | 1 |  |  |
|  | BMI-1500 (liquid/dimer acid-modified) | 1 | 1 |  | 2 |  |
|  | BMI-1700 (liquid/dimer acid-modified) |  |  |  |  |  |
|  | BMI-3000 (solid/dimer acid-modified) |  |  |  |  | 1 |

TABLE 2-1-continued

| Component | Formulation [parts] * Converted into solid content | | | | | |
|---|---|---|---|---|---|---|
| (D) | EXA-835LV | | 0.5 | 1 | | |
| | jER871 | 1 | 0.5 | | 1.5 | 1.5 |
| | Lecy | | | | | |
| Additives | Ag filler | | | | | |
| | Silane coupling agent | | | | | |
| Measurement results | Curing properties (cured at 200° C. × 30 minutes) | Good | Good | Good | Good | Good |
| | Heat resistance (weight loss) [%] | Fair (8.1) | Fair (9.2) | Fair (1.7) | Fair (10.7) | Fair (10.1) |
| | Adhesive strength (normal temperature) [N/mm2] | Good (42.1) | Good (41.4) | Good (54.0) | Good (34.8) | Good (42.1) |
| | Adhesive strength (200° C.) [N/mm2] | Good (10.1) | Good (9.1) | Good (12.1) | Fair (6.8) | Good (10.2) |
| | Strength change ratio (%) | Good (76.0) | Good (78.0) | Good (77.6) | Good (80.5) | Good (75.8) |
| | Normal temperature elastic modulus (Gpa) | Good (1.1) | Good (1.6) | Fair (3.3) | Fair (2.2) | Fair (2.0) |
| | Comprehensive evaluation | Excellent | Excellent | Excellent | Good | Good |

| Component | Formulation [parts] * Converted into solid content | Example 10 (Resin composition j) | Example 11 (Resin composition k) | Example 12 (Resin composition l) | Example 13 (Resin composition m) | Example 14 (Resin composition n) |
|---|---|---|---|---|---|---|
| (A) | F-a type benzoxazine | 1.33 | 1.33 | | 1.33 | 1.33 |
| | P-d type benzoxazine | | | 1.33 | | |
| (A') | H-4 (phenol/Tg 123° C.) | | | | | |
| | MEH-7500 (phenol/Tg 170° C.) | | | | | |
| | MEH-8005 (phenol/Tg 105° C.) | | | | | |
| (B) | EH-3636AS (DICY) | 0.3 | | 0.3 | 0.3 | 0.3 |
| | EH-3842 (DICY + accelerator) | | 0.1 | | | |
| | 2PHZ-PW (IMZ) | | | | | |
| | 2P4MHZ-PW (IMZ) | | | | | |
| (B') | DDH | | | | | |
| (C) | BMI (solid) | | | | | |
| | BMI-1500 (liquid/dimer acid-modified) | 1 | 1 | 1 | | 1 |
| | BMI-1700 (liquid/dimer acid-modified) | | | | 1 | |
| | BMI-3000 (solid/dimer acid-modified) | | | | | |
| (D) | EXA-835LV | | 1 | 1 | | |
| | jER871 | 1 | | | 1 | 1 |
| | Lecy | | | | | |
| Additives | Ag filler | 9 | | | | |
| | Silane coupling agent | | | | | 0.05 |
| Measurement results | Curing properties (cured at 200° C. × 30 minutes) | Good | Good | Good | Good | Good |
| | Heat resistance (weight loss) [%] | Good (1.7) | Good (7.7) | Good (7.6) | Fair (8.3) | Fair (8.0) |
| | Adhesive strength (normal temperature) [N/mm2] | Good (50.6) | Good (50.6) | Good (36.6) | Good (55.3) | Good (54.5) |
| | Adhesive strength (200° C.) [N/mm2] | Good (11.2) | Good (11.4) | Good (9.8) | Good (13.8) | Good (10.5) |
| | Strength change ratio (%) | Good (77.9) | Good (77.5) | Good (73.2) | Good (75.0) | Good (80.7) |
| | Normal temperature elastic modulus (Gpa) | Fair (3.6) | Fair (3.1) | Fair (2.6) | Good (1.0) | Good (1.8) |
| | Comprehensive evaluation | Excellent | Excellent | Excellent | Excellent | Excellent |

TABLE 2-2

| Component | Formulation [parts] * Converted into solid content | Example 15 (Resin composition o) | Example 16 (Resin composition p) | Example 17 (Resin composition q) | Example 18 (Resin composition r) | Comparative Example 7 (Resin composition η) |
|---|---|---|---|---|---|---|
| (A) | F-a type benzoxazine | 1.33 | 2 | 1.33 | 1.33 | |
| | P-d type benzoxazine | | | | | |

TABLE 2-2-continued

| Component | | | | | | |
|---|---|---|---|---|---|---|
| (A') | H-4 (phenol/Tg 123° C.) | | | | | 1.33 |
| | MEH-7500 (phenol/Tg 170° C.) | | | | | |
| | MEH-8005 (phenol/Tg 105° C.) | | | | | |
| (B) | EH-3636AS (DICY) | 0.45 | 0.3 | 0.2 | 0.3 | 0.3 |
| | EH-3842 (DICY + accelerator) | | | | | |
| | 2PHZ-PW (IMZ) | | | 0.1 | | |
| | 2P4MHZ-PW (IMZ) | | | | | |
| (B') | DDH | | | | | |
| (C) | BMI (solid) | | | | | |
| | BMI-1500 (liquid/dimer acid-modified) | 2 | 2 | 1 | 1 | 1 |
| | BMI-1700 (liquid/dimer acid-modified) | | | | | |
| | BMI-3000 (solid/dimer acid-modified) | | | | | |
| (D) | EXA-835LV | | | | | |
| | jER871 | 0.75 | 1 | 1 | | 1 |
| | Lecy | | | | 1 | |
| Additives | Ag filler | | | | | |
| | Silane coupling agent | | | | | |
| Measurement results | Curing properties (cured at 200° C. × 30 minutes) | Good | Good | Good | Good | Good |
| | Heat resistance (weight loss) [%] | Fair (8.3) | Good (5.0) | Fair (10.4) | Good (7.8) | Poor (20.9) |
| | Adhesive strength (normal temperature) [N/mm2] | Good (54.8) | Good (56.2) | Good (48.5) | Good (45.5) | Poor (19.9) |
| | Adhesive strength (200° C.) [N/mm2] | Good (11.8) | Good (12.9) | Good (8.1) | Good (9.5) | Poor (0.9) |
| | Strength change ratio (%) | Good (78.5) | Good (77.0) | Good (83.3) | Good (79.1) | Poor (95.5) |
| | Normal temperature elastic modulus (Gpa) | Fair (2.4) | Fair (2.5) | Good (1.9) | Fair (3.0) | Fair (4.3) |
| | Comprehensive evaluation | Good | Excellent | Excellent | Excellent | Poor |

| Component | Formulation [parts] * Converted into solid content | Comparative Example 8 (Resin Composition θ) | Comparative Example 9 (Resin Composition ι) | Comparative Example 10 (Resin Composition κ) | Comparative Example 11 (Resin Composition λ) | Comparative Example 12 (Resin composition μ) |
|---|---|---|---|---|---|---|
| (A) | F-a type benzoxazine | | | | | |
| | P-d type benzoxazine | | | | | 1.33 |
| (A') | H-4 (phenol/Tg 123° C.) | | | 1 | | |
| | MEH-7500 (phenol/Tg 170° C.) | 1.33 | | | 1 | |
| | MEH-8005 (phenol/Tg 105° C.) | | 1.33 | | | |
| (B) | EH-3636AS (DICY) | 0.3 | 0.3 | 0.3 | 0.3 | |
| | EH-3842 (DICY + accelerator) | | | | | |
| | 2PHZ-PW (IMZ) | | | | | |
| | 2P4MHZ-PW (IMZ) | | | | | |
| (B') | DDH | | | | | 1 |
| (C) | BMI (solid) | | | | | |
| | BMI-1500 (liquid/dimer acid-modified) | 1 | 1 | 1 | 1 | 1 |
| | BMI-1700 (liquid/dimer acid-modified) | | | | | |
| | BMI-3000 (solid/dimer acid-modified) | | | | | |
| (D) | EXA-835LV | | | 1 | 1 | 1 |
| | jER871 | 1 | 1 | | | |
| | Lecy | | | | | |
| Additives | Ag filler | | | | | |
| | Silane coupling agent | | | | | |

TABLE 2-2-continued

| Measurement results | | | | | | |
|---|---|---|---|---|---|---|
| | Curing properties (cured at 200° C. × 30 minutes) | Good | Good | Good | Good | Good |
| | Heat resistance (weight loss) [%] | Good (4.6) | Good (7.5) | Good (7.7) | Good (5.9) | Good (6.1) |
| | Adhesive strength (normal temperature) [N/mm2] | Poor (11.8) | Poor (18.8) | Good (43.7) | Good (43.8) | Good (58.8) |
| | Adhesive strength (200° C.) [N/mm2] | Poor (0.2) | Poor (0.4) | Poor (2.1) | Poor (1.4) | Poor (4.0) |
| | Strength change ratio (%) | Poor (98.3) | Poor (97.9) | Poor (95.2) | Poor (96.8) | Poor (93.2) |
| | Normal temperature elastic modulus (Gpa) | Fair (4.8) | Fair (4.2) | Fair (4.5) | Poor (5.6) | Good (1.5) |
| | Comprehensive evaluation | Poor | Poor | Poor | Poor | Poor |

As illustrated in Table 2-1and Table 2-2, there was obtained the result that the resin compositions of Examples 5 to 18 have long-term heat resistance, rapid curing properties, high adhesive strength during heating, a low change ratio of adhesive strength, and a low normal temperature elastic modulus, similarly to the resin compositions of Examples 1 to 4.

Here, there was obtained the result that when the (A') component which has only an OH group was used, instead of the (A) component, as in Comparative Examples 7 to 11, adhesive strength during heating is low, and a strength change ratio and a normal temperature elastic modulus are high, compared to Examples. It is considered that the reason why a normal temperature elastic modulus is high is that the (A') component does not have an N group, thereby inhibiting the reaction with the (C) component. That is, the resin compounds of Comparative Examples 7 to 11 can have only a linear structure as indicated in FIG. 2. Therefore, the molecular chain can expand and contract only in one direction. Accordingly, flexibility is low. It is considered that this causes the resin compounds of Comparative Examples 7 to 11 to have an increased normal temperature elastic modulus.

Also, as obvious from the result of Comparative Example 12, when a compound other than dicyandiamide and/or imidazoles was used as the (B) component, adhesive strength during heating was low, and a strength change ratio of adhesive strength was high. It is considered that the reason for this is as follows. That is, dicyandiamide and imidazoles act as a catalyst during curing. Furthermore, an N atom is introduced into a polymer network. Therefore, adhesiveness with metal improves. On the other hand, such a function does not work with the (B') component used in Comparative Example 12.

It is noted that Example 5 is an example in which the (C) component and the (D) component of Example 7 are substituted with materials having a dimer acid backbone (it is noted that Example 1 is an example in which the (C) component of Example 7 is substituted with a material having a dimer acid backbone). As obvious from this result, when a material having a dimer acid backbone is used as the (C) component and/or the (D) component, the normal temperature elastic modulus of a cured product of the resin composition can be suppressed further low.

Also, as obvious from Example 10 and Example 14, even when an additive is added, a result similar to other Examples was obtained. In particular, even when a large amount of a conductive filler is contained, these effects can be obtained. Therefore, the adhesive according to the present invention is extraordinarily useful as a conductive adhesive.

Also, a result similar to other Examples was obtained, even when benzoxazine, which is not used in other Examples, is used as the (A) component as in Example 12, or cyanate ester, instead of epoxy resin, is used as the (D) component as in Example 18.

Also, as obvious from Example 15 and Example 16, there was obtained the result that the change of ratios of the (A) component to the (D) component in Example 5 hardly has an influence on long-term heat resistance, rapid curing properties, adhesive strength during heating, a change ratio of adhesive strength, a normal temperature elastic modulus, and the like.

[Printing Performance by Variation of (C) Component]

The conductivity and printing performance of the resin compositions obtained in Examples 19 to 21 described below were calculated.

As the (A) component, a 66% solution of "F-a type benzoxazine" was used. As the (B) component, "EH-3636AS" was used. As the (C) component, "BMI" or "BMI-1500" was used. As the (D) component, "jER871" was used. As an additive, an Ag filler was used.

Example 19

Into a container, there were poured 2 parts (solid content: 1.33 parts) of a 66% solution of "F-a type benzoxazine," 0.3 parts of "EH-3636AS," 1 part of "BMI1500," 1 part of "jER871," and 17 parts of an "Ag filler." The mixture was hand-stirred. Thereafter, the obtained product was dispersed using a triple roll mil, thereby to prepare a resin composition s.

Example 20

Into a container, there were poured 2 parts (solid content: 1.33 parts) of a 66% solution of "F-a type benzoxazine," 0.3 parts of "EH-3636AS," 1 part of "BMI1500," 1 part of "jER871," and 20 parts of an "Ag filler." The mixture was hand-stirred. Thereafter, the obtained product was dispersed using a triple roll mil, thereby to prepare a resin composition t.

Example 21

Into a container, there were poured 2 parts (solid content: 1.33 parts) of a 66% solution of "F-a type benzoxazine," 0.3 parts of "EH-3636AS," 1 part of "BMI," 1 part of "jER871," and 17 parts of an "Ag filler." The mixture was hand-stirred. Thereafter, the obtained product was dispersed using a triple roll mil, thereby to prepare a resin composition u.
(Measurement of Conductivity)

The resin composition was spread on a screen mask (emulsion thickness: 20 μm, #200 mesh, pattern dimension: 1 mm×71 mm). Then, screen printing was performed on an alumina substrate. Thereafter, the obtained product was left to stand at 200° C. for 30 minutes for curing. Thus, a test piece was obtained. The resistance value and film thickness of the obtained test piece were measured using a digital multimeter and a surface roughness tester. The specific resistance value of the cured resin composition was calculated.

In the measurement results, the specific resistance value of $1\times10^{-3}$ Ω·cm or less was evaluated as "Good."
(Measurement of Printing Performance)

The resin composition was spread on a metal mask having a thickness of 70 μm and a pattern dimension of 1.6×0.9 mm. Then, stencil printing was performed with the resin composition on an alumina substrate using a metal squeegee. Thereafter, the obtained product was left to stand at 200° C. for 30 minutes for curing.

The presence or absence of rubbing on the pattern of the cured coated film was visually inspected.

In the measurement results, the case without rubbing was evaluated as "Good." The case having rubbing only on the periphery of the pattern was evaluated as "Fair."

ides are used (Example 21). Therefore, there was obtained the result that in spite of the addition of a conductive filler, printing performance is excellent.

As obvious from Examples and Comparative Examples described above, the resin composition which includes (A) a compound having in its molecule an OH group and any one of primary to tertiary amines, (B) dicyandiamide, and (D) a compound having in its molecule one or more epoxy groups, or cyanate ester, has long-term heat resistance, rapid curing properties, high adhesive strength during heating, a low change ratio of adhesive strength, and a low normal temperature elastic modulus.

The invention claimed is:
1. A resin composition comprising:
   (A) a compound having in its molecule an OH group and any one of primary to tertiary amines;
   (B) dicyandiamide and/or imidazoles;
   (C) dimer acid-modified bismaleimides; and
   (D) a compound having in its molecule one or more epoxy groups, or cyanate ester.
2. The resin composition according to claim 1, wherein (D) is a compound having a dimer acid backbone.
3. The resin composition according to claim 1, wherein (A) is a compound having a benzoxazine backbone.
4. A conductive resin composition comprising the resin composition according to claim 1 and a conductive filler.
5. A conductive adhesive comprising the conductive resin composition according to claim 4.
6. A semiconductor device comprising a cured product of the conductive adhesive according to claim 5.
7. A paste for forming electrodes comprising the conductive resin composition according to claim 4.
8. A semiconductor device comprising a cured product of the paste for forming electrodes according to claim 7.
9. A semiconductor device comprising a cured product of the conductive resin composition according to claim 4.
10. An adhesive comprising the resin composition according to claim 1.
11. A semiconductor device comprising a cured product of the adhesive according to claim 10.

TABLE 3

| Component | Formulation [parts] * Converted into solid content | Example 19 (Resin composition s) | Example 20 (Resin composition t) | Example 21 (Resin composition u) |
|---|---|---|---|---|
| (A) | F-a type benzoxazine | 1.33 | 1.33 | 1.33 |
| (B) | EH-3636AS (DICY) | 0.3 | 0.3 | 0.3 |
| (C) | BMI (solid) | | | 1 |
| | BMI-1500 (liquid/dimer acid-modified) | 1 | 1 | |
| (D) | jER871 | 1 | 1 | 1 |
| Additives | Ag filler | 17 | 20 | 17 |
| Measurement results | Specific resistance value ($\leq 1 \times 10^{-3}$ Ω · cm) | Good | Good | Good |
| | Printing performance | Good | Good | Fair |

As illustrated in Table 3, it became obvious that the resin composition of any of Examples can have sufficient conductivity. Furthermore, the viscosity of the resin composition can be lowered when liquid bismaleimides are used (Example 19 and Example 20) than when solid bismaleim- 12. A semiconductor device comprising a cured product of the resin composition according to claim 1.
13. The resin composition according to claim 1, wherein (C) is liquid at 20° C.±15° C.

* * * * *